United States Patent [19]

Guisinger

[11] 4,386,378
[45] May 31, 1983

[54] HIGH GAIN, CURRENT MODE PREAMPLIFIER

[75] Inventor: Barrett E. Guisinger, Saratoga, Calif.

[73] Assignee: Sony Corporation, Japan

[21] Appl. No.: 227,614

[22] Filed: Jan. 23, 1981

[51] Int. Cl.³ .......................... G11B 5/09; G11B 5/02
[52] U.S. Cl. ...................................... 360/46; 360/67; 360/68
[58] Field of Search ........................ 360/46, 67, 68; 330/260, 290, 293

[56] References Cited

U.S. PATENT DOCUMENTS

| | | | |
|---|---|---|---|
| 4,053,936 | 10/1977 | Foust | 360/67 |
| 4,081,845 | 3/1978 | Braitberg | 360/68 |
| 4,157,574 | 6/1979 | Stamer | 360/67 |
| 4,271,439 | 6/1981 | Wray | 360/68 |
| 4,317,142 | 2/1982 | Wray | 360/67 |

Primary Examiner—Vincent P. Canney
Attorney, Agent, or Firm—Philip M. Shaw, Jr.

[57] ABSTRACT

A high gain, current mode preamplifier for magnetic media recording and reproduction wherein a differential amplifier has its non-inverting input connected to the circuit ground through a first resistance, its inverting input is connected to the circuit ground through a second resistance, and its output is connected to the inverting input through a third resistance, and with the magnetic head being selectively connected in parallel with the third resistance during recording and across the amplifier input terminals during playback.

8 Claims, 9 Drawing Figures

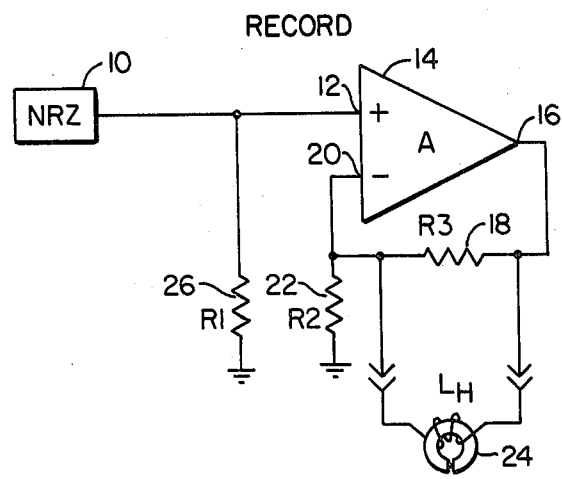
FIG._1.
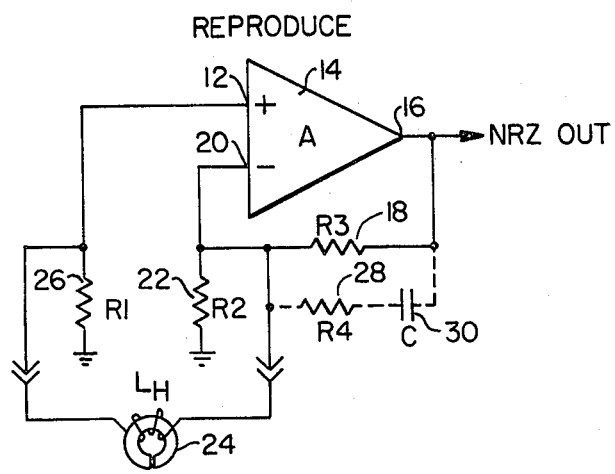
FIG._2.
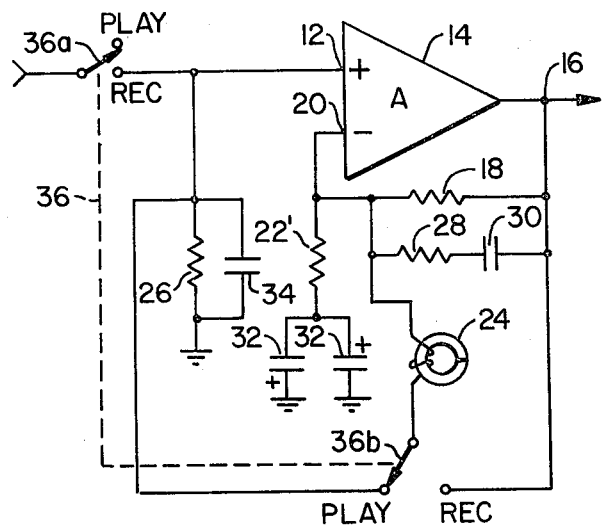
FIG._3.

HIGH GAIN, CURRENT MODE PREAMPLIFIER

BACKGROUND OF THE INVENTION

1. Field of the Invention

The present invention relates to a preamplifier and more particularly to a high gain current preamplifier for use in reading and writing signals on magnetic media.

2. Description of the Prior Art

In recording and writing signals on magnetic media it is desirable to have the writing circuit be independent or nearly independent of the relative speed between the magnetic head and the magnetic media. Designers have found that a magnetic head and head circuitry operating in a current mode provides the best approximation to this desired goal. This is especially true in recording and reading non-return to zero (NRZ) data.

One problem with prior art circuits of this type is that current losses within the magnetic head became quite significant because of the relatively low gain of the circuit.

SUMMARY OF THE INVENTION

The above and other disadvantages of prior art current mode preamplifiers for recording and reproducing signals on magnetic media are overcome by the present invention, which comprises a circuit ground, a differential amplifier having an inverting input terminal, a non-inverting input terminal, and an output terminal. A first resistance is connected between the non-inverting input terminal and the circuit ground and a second resistance is connected between the inverting input terminal and the circuit ground. A third resistance is connected between the output terminal and the inverting input terminal. During recording, the magnetic head is connected in parallel with the third resistance. During playback, the magnetic head is connected between the inverting input terminal and the non-inverting input terminal of the amplifier. In the preferred embodiment, means are provided to selectively switch the head between being in parallel with the third resistance during recording and across the input terminals of the amplifier during playback.

The addition of the first resistance adds a large gain multiplier to the circuit and makes the magnetic head appear as an almost ideal current source. In a preferred embodiment, a fourth resistance and a capacitance are connected in series between the output terminal and the inverting input terminal to allow for compensation for resistive losses in the magnetic head by the proper choice of values of the fourth resistance and the capacitance. Applications for the preamplifier circuit of the invention include recording and reproduction of control track or address code tracks on video recorders and recording and reproduction of data signals on magnetic disc systems.

It is therefore an object of the present invention to provide a very high gain current mode preamplifier for use in recording and reproducing signals on magnetic media.

It is another object of the invention to provide a current mode preamplifier for use in recording and reproducing signals on magnetic media which amplifier is suitable for integration.

It is still a further object of the invention to provide a current mode preamplifier for recording and reproducing signals on magnetic media which allows the reproduction of NRZ data in its original form without requiring differentiation detection.

It is yet a further object of the invention to provide a high gain current mode preamplifier for recording and reproducing signals on magnetic media with a constant output amplitude over a speed change of approximately 1,000 to 1.

BRIEF DESCRIPTION OF THE DRAWINGS

FIG. 1 is a schematic diagram of a current mode preamplifier according to the invention for recording signals on magnetic media;

FIG. 2 is a schematic diagram of an impedance transforming preamplifier according to the invention for reproducing signals recorded on magnetic media;

FIG. 3 is a schematic diagram of a record/play preamplifier according to the invention.

DETAILED DESCRIPTION OF THE PREFERRED EMBODIMENT

Figure 4:
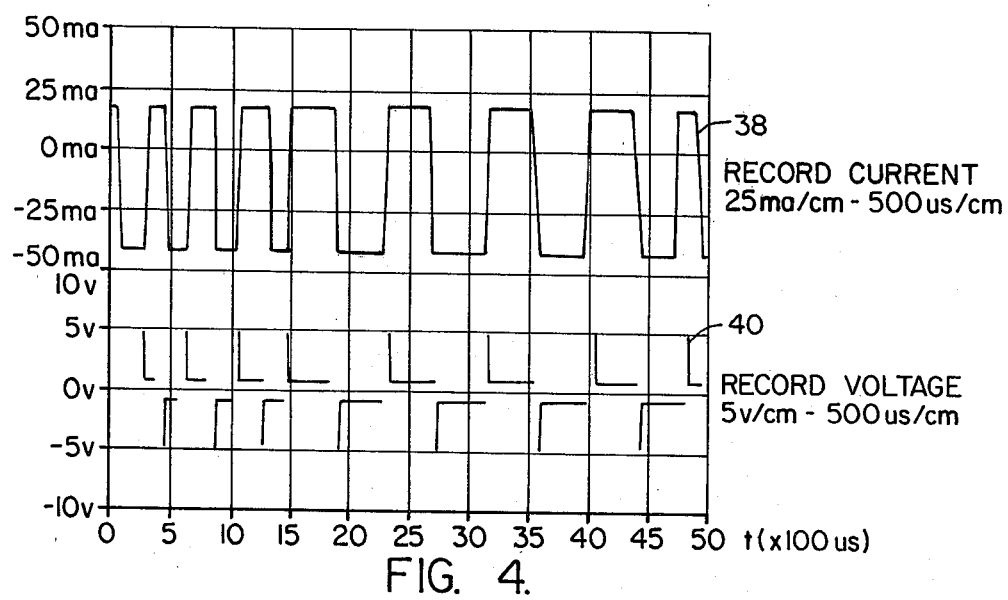
FIGS. 4 through 9, inclusive, are waveform diagrams for use in illustrating the operation of the preamplifier according to the invention.

NRZ data from an external source 10 is supplied to the non-inverting (+) input 12 of a differential amplifier 14. The output of the amplifier 16 is connected through a resistance 18 to the inverting (−) input 20 of the amplifier 14. The inverting input 20 is also connected through a resistance 22 to the circuit ground. A magnetic head 24 is connected in parallel with the resistance 18. A resistance 26 is connected between the input 12 and the circuit ground. If the reactive loss of the head is much, much smaller than the resistance 18, then current flowing through the head will be approximately equal to the voltage input at terminal 12 divided by the value of resistance 22.

Referring now more particularly to FIG. 2, the preamplifier in a reproduction configuration is illustrated. In this configuration, the magnetic head 24 is connected between the inputs 12 and 20 and the output is taken at output terminal 16. A resistance 28 in series with a capacitance 30 can be connected between the output 16 and the inverting terminal 20 in order to compensate for resistive losses of the magnetic head. The values of the resistance 28 and the capacitance 30 are selected to make this compensation in a manner known to those skilled in the art, and, in any case, can be easily done empirically. In this configuration, the voltage output $V_o$ can be found according to the formula:

$$V_o = I_H[R_{18} + R_{26}(1 + R_{18})/R_{22}]$$

where $I_H$ = magnetic head current $R_{18}$, $R_{22}$, $R_{26}$ = resistances of resistors 18, 22 and 26, respectively.

The added gain from the resistance 26 is the product of the resistance 26 times the sum within the parenthesis.

Referring now more particularly to FIG. 3, the preamplifier in the combined configuration is illustrated. In this embodiment, a double pole, double throw switch 36, having aarms 36a and 36b, supplies data through the switch arm 36a to the input 12 when the switch arm 36a is in the record (REC) position. In this same position, the magnetic head 24 is connected through the switch arm 36b to be in parallel with the resistance 18. In the play mode, the input data is not supplied through the switch arm 36a and the head 24 is connected through the switch arm 36b to be across the terminals 12 and 20 of the amplifier 14. Obviously the switch 36, although depicted as being mechanical, could also be electronic.

The particular configuration illustrated in FIG. 3 can be used for recording SMPTE time code. The time code would be fed into the circuit through the switch arm 36a and derived out of the output terminal 16 on playback. A capacitor 34 is connected in parallel with the resistor 26. A pair of dielectric capacitors 32 are connected in parallel with each other and in series between the circuit ground and one end of the resistor 22'. The other end of the resistor 22' is connected to the inverting input terminal 20. The following values may be taken as typical for this circuit and are in no way meant as limiting but are simply illustrative:

Resistor 18 = 5,100 ohms
Resistor 22' = 20 ohms
Resistor 26 = 1,000 ohms
Resistor 28 = 1,000 ohms
Capacitor 30 = 0.22 mfd.
Capacitor 32 = 150 mfd.
Capacitor 34 = 0.0033 mfd.
Amplifier 14 = Signetics model SE5534
inductance of magnetic head 24 = 1.2 mh Referring now more particularly to FIG. 4, waveforms 38 and 40 represent the record current and voltage, respectively, applied to the head 24 with respect to time. Record current is set at 150% of the tape saturation to make the system self-erasing.

Figure 5:
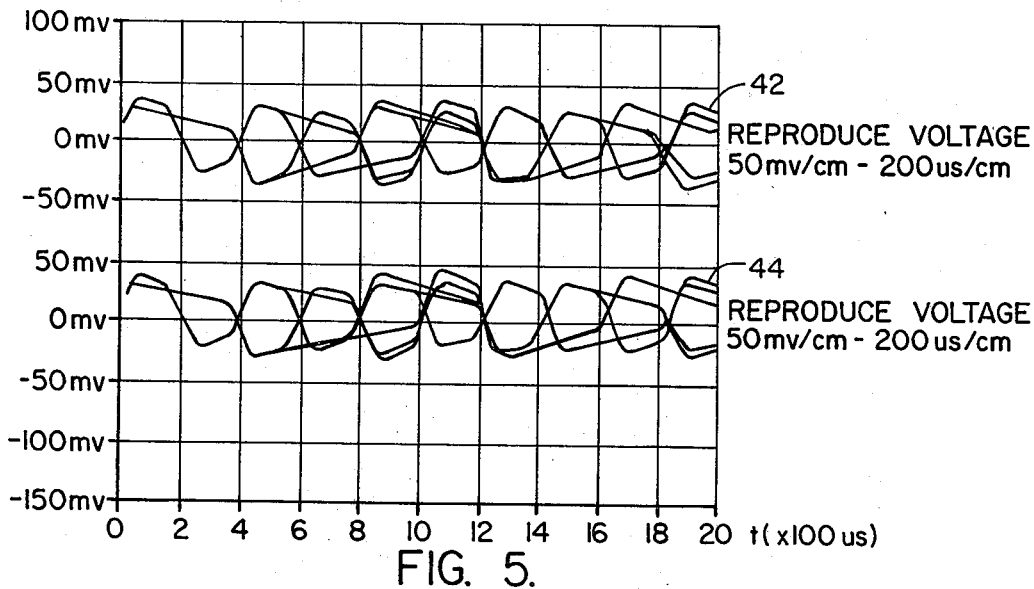
Figure 6:
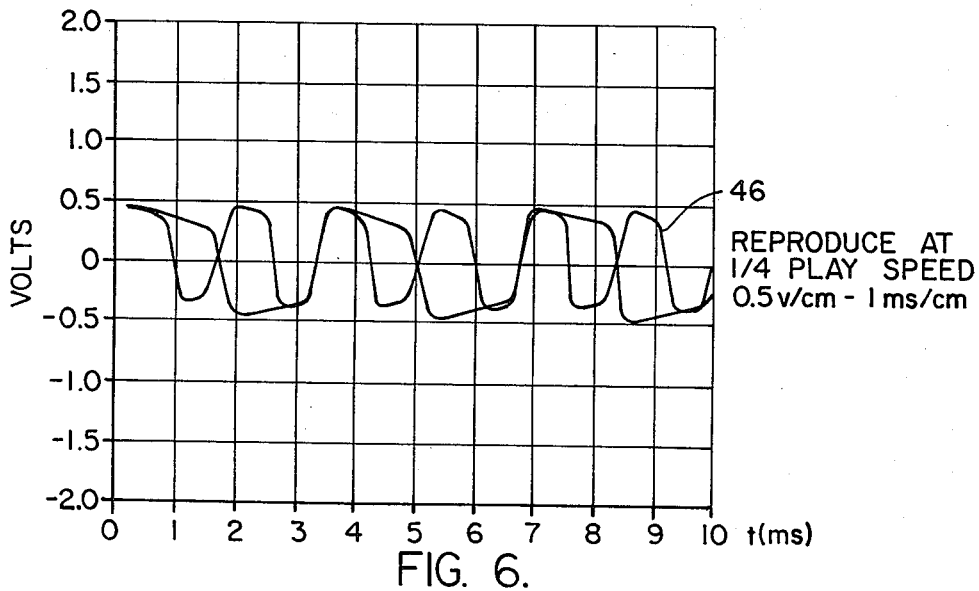
Figure 7:
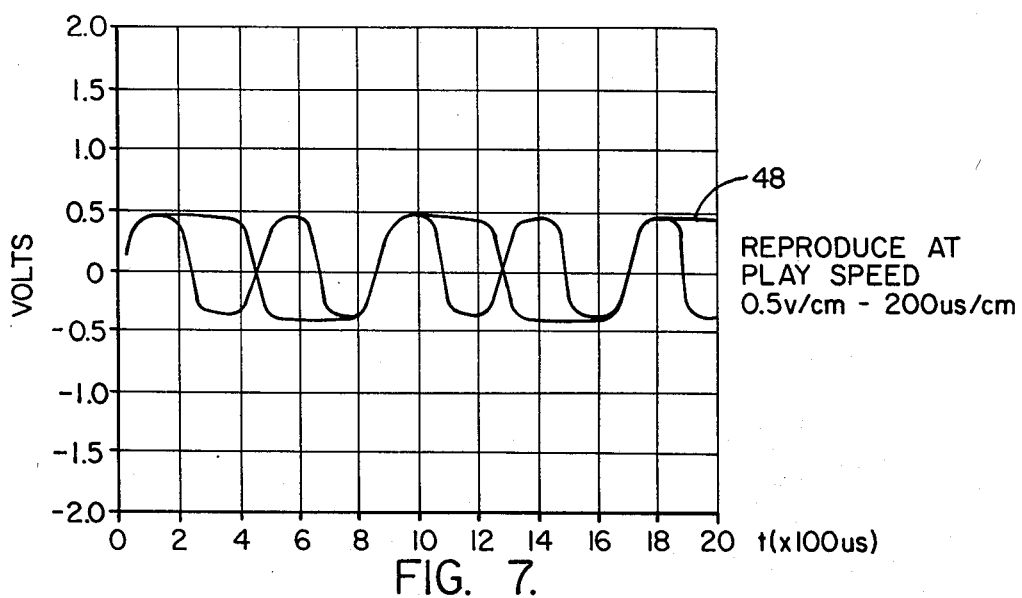
Figure 8:
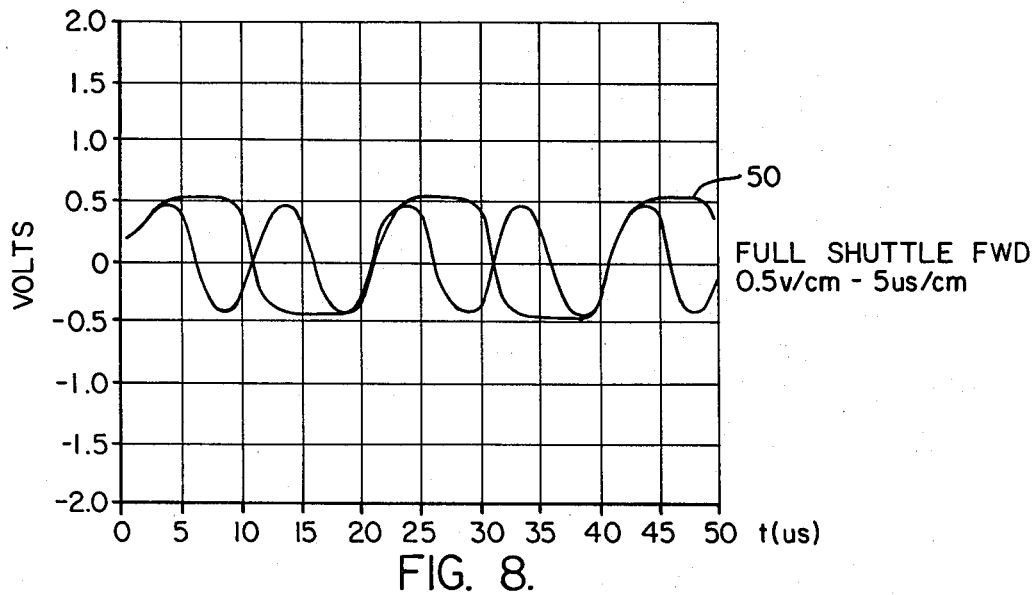
Figure 9:
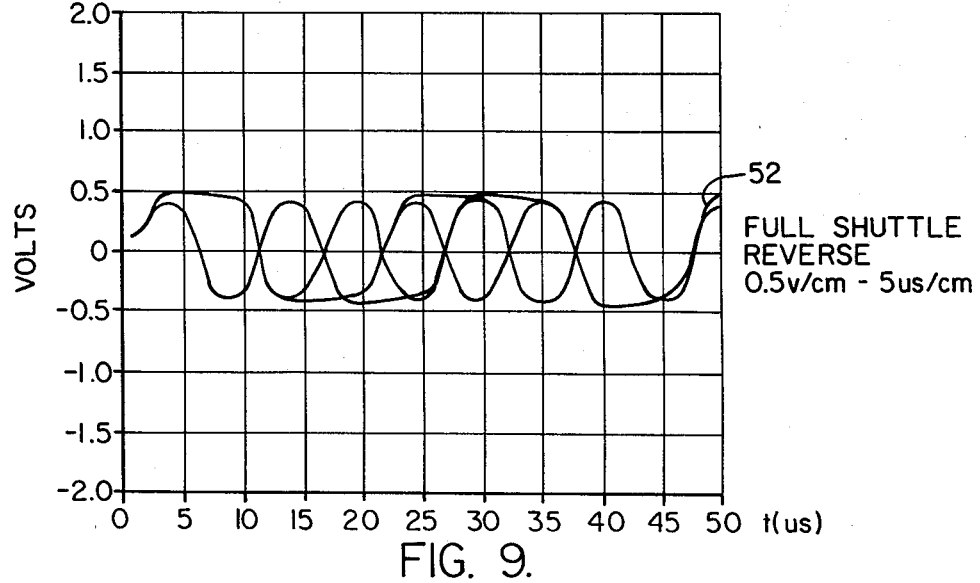

In FIG. 5, the waveform 42 represents the voltage with respect to time appearing at the inverting input terminal 20 during playback of the recorded signal illustrated in FIG. 4. The waveform 44 appears at the non-inverting input terminal 12. Note that the signals are in phase and approximately 50 mv p-p. The actual open circuit head voltage is only 1.0 mv p-p and is a differentiated waveform. If the voltage at the input terminal 12 is subtracted from the voltage appearing at input terminal 20, the resultant is the 1.0 mv p-p voltage waveform. This playback takes place at the standard playback speed.

The waveform 46 illustrates the voltage output with respect to time at the output terminal 16 during one-fourth speed playback. The waveforms 48, 50 and 52 represent the same output at play speed, full shuttle forward speed and full shuttle reverse speed, respectively. Note that at all the speeds shown the output amplitude remains the same. The foregoing waveforms were derived from a Sony model BVH-1000 recorder with a record/playback head modified to have an inductance of 1.2 mh and using the circuit depicted in FIG. 3.

The terms and expressions which have been employed here are used as terms of description and not of limitation, and there is no intention, in the use of such terms and expressions of excluding equivalents of the features shown and described, or portions thereof, it being recognized that various modifications are possible within the scope of the invention as claimed.

What is claimed is:

1. A very high gain current mode preamplifier for recording and reproducing signals on magnetic media comprising
   a circuit ground,
   a differential amplifier having an inverting input terminal, a non-inverting input terminal and an output terminal,
   a first resistance connected between the non-inverting input terminal and the circuit ground,
   a second resistance connected between the inverting input terminal and the circuit ground, and
   a third resistance connected between the output terminal and the inverting input terminal and further comprising a magnetic recording head connected in parallel with the third resistance.

2. A very high gain current mode preamplifier for recording and reproducing signals on magnetic media comprising
   a circuit ground,
   a differential amplifier having an inverting input terminal, a non-inverting input terminal and an output terminal,
   a first resistance connected between the non-inverting input terminal and the circuit ground,
   a second resistance connected between the inverting input terminal and the circuit ground, and
   a third resistance connected between the output terminal and the inverting input terminal and further comprising a magnetic reproducing head connected between the inverting input terminal and the non-inverting input terminal.

3. A very high gain current mode preamplifier for recording and reproducing signals on magnetic media comprising
   a circuit ground,
   a differential amplifier having an inverting input terminal, a non-inverting input terminal and an output terminal,
   a first resistance connected between the non-inverting input terminal and the circuit ground,
   a second resistance connected between the inverting input terminal and the circuit ground, and
   a third resistance connected between the output terminal and the inverting input terminal and further comprising a magnetic head and means for selectively connecting the head either in parallel with the third resistance or between the inverting and non-inverting input terminals.

4. A preamplifier as recited in claims 1 or 3 further including means for selectively supplying non-return to zero electrical signal data from an external source between the non-inverting input and the circuit ground.

5. A preamplifier as recited in claims 2 or 3 wherein non-return to zero electrical signals reproduced by the magnetic head produce an output signal between the output terminal and the circuit ground.

6. A preamplifier as recited in claims 2 or 3 further comprising a fourth resistance and a capacitance connected in series between the output terminal and the inverting input terminal, whereby resistance losses in the magnetic head can be compensated by the choice of values of the fourth resistance and the capacitance.

7. A preamplifier as recited in claim 3 where the selective connecting means comprise
   (a) a first switch having a record position and a playback position, the switch being connected to the non-inverting input terminal to supply input data from an external source to the non-inverting input terminal when the first switch is in the record position, and
   (b) a second switch having a record position and a playback position and further having a pole arm and two throw terminals, the magnetic head being connected in series between the pole arm and the inverting input terminal, and wherein the first of the throw terminals is connected to the output terminal and is contacted by the pole arm when the second switch is in the record position and the second of the throw terminals is connected to the non-inverting input terminal and is contacted by the pole arm when the second switch is in the playback position.

8. A preamplifier as recited in claim 7 further comprising a first capacitance connected in parallel with the first resistance and a second capacitance connected in series with the second resistance between the circuit ground and the inverting input terminal.

* * * * *